United States Patent [19]

Kawatsuki et al.

[11] Patent Number: 4,777,116
[45] Date of Patent: Oct. 11, 1988

[54] METHOD FOR MANUFACTURING PHASE GRATINGS OF A COMBINATION PATTERN-REFRACTION MODIFICATION TYPE

[75] Inventors: Nobuhiko Kawatsuki; Masao Uetsuki, both of Kurashiki, Japan

[73] Assignee: Kuraray Co., Ltd., Japan

[21] Appl. No.: 921,589

[22] Filed: Oct. 21, 1986

[30] Foreign Application Priority Data

Oct. 22, 1985 [JP] Japan .................. 60-236752

[51] Int. Cl.$^4$ .................. G03C 5/16; G03C 5/00
[52] U.S. Cl. .................. 430/290; 430/325; 430/330; 430/285; 430/287
[58] Field of Search .............. 430/290, 287, 285, 325, 430/330

[56] References Cited

U.S. PATENT DOCUMENTS

| | | | |
|---|---|---|---|
| 3,376,138 | 4/1968 | Giangualano et al. | 430/325 X |
| 3,689,264 | 9/1972 | Chandross et al. | 430/290 X |
| 3,993,485 | 11/1976 | Chandross et al. | 430/285 X |
| 4,001,016 | 1/1977 | Rosenkranz et al. | 430/287 X |
| 4,187,111 | 2/1980 | Chandross et al. | 430/290 X |

FOREIGN PATENT DOCUMENTS

| | | | |
|---|---|---|---|
| 0021522 | 2/1985 | Japan | 430/330 |
| 0112035 | 6/1985 | Japan | 430/287 |

*Primary Examiner*—Paul R. Michl
*Assistant Examiner*—Cynthia Hamilton
*Attorney, Agent, or Firm*—Ostrolenk, Faber, Gerb & Soffen

[57] ABSTRACT

A method for manufacturing a combination pattern-refraction modification type phase grating comprises the steps of (1) forming a thin film of composition which includes a photosensitive acrylic acid or methacrylic acid group polymer including double bonds between carbons and at least one of compounds selected from aromatic aldehyde and aromatic ketone which have a substituent or a no-substituent (2) irradiating the thin film in a regularly arranged pattern with ultraviolet rays and (3) removing the non-reacted compound.

10 Claims, 2 Drawing Sheets

METHOD FOR MANUFACTURING PHASE GRATINGS OF A COMBINATION PATTERN-REFRACTION MODIFICATION TYPE

BACKGROUND OF THE INVENTION

The present invention relates to a method for manufacturing phase gratings which diffract light beams according to phase control, and more particularly, phase gratings having combined characteristics of a pattern modification type and a refraction modification type phase grating.

In general, a phase change P which is caused when light beams of wavelength $\lambda$ travel a distance D within a light medium of a refractive index n is shown by the equation $$P = \frac{2\pi}{\lambda} Dn.$$

When a periodic distribution of the phase variation P is caused on an exit plane of the light medium due to variations in the distance D and the refractive index n, the light beam are diffracted in such a direction that light beam components with different phase changes P amplify each other by phase matching.

Conventional phase gratings are broadly divided into the following two categories. One, as shown in FIG. 3, is a pattern modification type phase grating 1A which comprises a transparent plate 2A including regularly arranged convex-concave portions a, b for controlling phases of light beams and the other, as shown in FIG. 4, is a refraction modification type phase grating 1B which comprises a transparent plate 2B including regularly arranged layers a', b' of different refractive indexes, respectively, for controlling phases of light beams which pass therethrough.

The phase grating 1A shown in FIG. 3 is in common use for light branching elements, diffraction gratings for dividing light beams, Fresnel lenses and the like. With the phase grating 1A, however, in order to amplify diffracted light beams other than zero-order diffracted light beams by suppressing the latter, it is necessary to increase the difference in level of regularly arranged convex-concave portions, so that a high degree precision working is required when a diffraction angle is increased by minimizing the pitch of the convex-concave portions, resulting in difficulty in manufacturing phase gratings 1A.

In the phase grating 1B shown in FIG. 4, a method for amplifying diffracted light beams other than zero-order diffracted light beams by suppressing the latter is to increase the difference in refractive index between regularly arranged layers or thickness of the grating 1B. However, the increasable range of difference in refractive index is comparatively limited in practice, so that the phase grating 1B is disadvantageous in that its thickness is extremely increased as compared with the pattern modification type phase grating 1A.

We have already proposed a phase grating 1, as shown in FIG. 1, of a combination pattern-refraction modification type which positively utilizes an optical multiplication effect on the basis of the combined modifications of a pattern modification type phase grating 1A and a refraction modification type phase grating 1B.

Prior art in connection with formation of a difference in level and a difference in refractive index according to photoreaction are summarized only in the following two cases. The first case is shown in E. A. Chandross, C. A. Pryde, W. J. Tomlinson, and H. P. Weber; Appl. Phys. Lett., Vol. 24, No. 2 (1974), pp. 72 to 74. According to this, it is reported that after a film is formed on a pyrex substrate by a solution pile method, by adding a 16 weight percent of acrylic acid ethyl 2-(1-naphthyl) as a photoreactive dopant to a copolymer including a derivative of glycidyl methacrylate and methyl methacrylate, the dopant is dimerized by irradiating ultraviolet rays of wavelength 300 to 380 nm through a photomask and then non-reacted dopant is volatilized by heating for about one hour at temperatures of 100° to 105° C. in a nitrogen atmosphere, whereby the exposed portion increases in film thickness by about 15% and in refractive index by 0.8 to 1.0% as compared with a shaded portion.

The second case is shown in W. J. Tomlinson, H. P. Weber, C. A. Pryde, and E. A. Chandross, Appl. Phys. Lett., Vol. 26, No. 6 (1975), pp. 303 to 306. According to this, it is reported that it in the first case when a 13 weight percent of 2-naphthalenethiol is added as a photoresistant dopant, the dopant is bonded to a copolymer by irradiating ultraviolet beams, resulting in that an exposed portion increase in film thickness by about 10% and in refractive index by about 1.3% as compared with a shaded portion, whereby a ridge waveguide having a light propagation loss 0.3 dB/cm and a light coupler having a coupling intensity 15 dB/cm are manufactured.

These reports, however, are totally different from the present invention with respect to the subject matter, polymer material, photoreactive additive, film forming process, type of photoreaction, the upper limit of variations in film thickness and refractive index, and application. In addition, there is another report in which when a film of poly(methyl methacrylate) is irradiated by electron beams, film thickness increases and refractive index increases, whereby a diffraction grating is manufactured (H. Kotani, M. Kawabe and S. Namba, Japanese J. Appl. Phys., Vol. 18, No. 2 (1979), pp. 279 to 283). However, the report is independent of the present invention.

SUMMARY OF THE INVENTION

It is an object of the present invention to provide a method for manufacturing phase gratings of a combination pattern-refraction modification type which easily amplify a diffracted light beam by suppressing the zero-order diffracted light beam more than either of a pattern and a refraction modification type phase grating.

According to the present invention, a phase grating of the combination pattern-refraction modification type can be easily manufactured and is of great use for light distribution, focusing and the like in a micro-optical system.

DETAILED DESCRIPTION OF THE INVENTION

The present invention will be described hereinafter with reference to the accompanying drawings.

Figure 1:
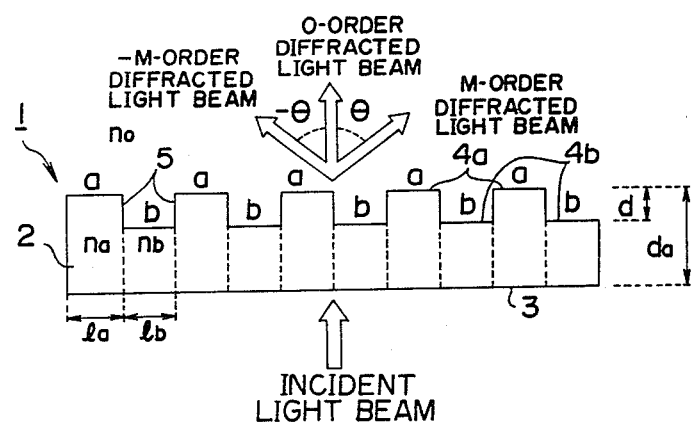
FIG. 1 is an enlarged section view of a phase grating of a combination pattern-refraction modification type according to the present invention.

FIG. 1 illustrates a phase grating 1 of a combination pattern-refraction modification type according to the present invention which includes dual grating elements a, b provided on a transparent flat plate 2 and a flat surface 3 as an incident plane of light rays. The flat incident surface 3 and respective exit surfaces 4a, 4b of the grating elements a, b are parallel to each other and interfaces 5 between the grating elements a, b are perpendicular to the incident surface 3. The grating element a has a refractive index $n_a$ and the grating element b has a refractive index $n_b$.

Now, let us denote symbols as follows:

| | |
|---|---|
| $d_a$: | Thickness of the grating |
| $l_a, l_b$: | Respective width of the grating elements a, b |
| $l = l_a + l_b$: | Pitch (width of a unit grating) |
| $a_a = l_a/l = a$ $a_b = l_b/l = 1 - a$ | Respective section fractional factors of the grating elements a, b |
| $n_0$: | Refractive index of the air, that is, the exterior of the exit surface |
| $\lambda$: | Wavelength |
| m: | Integer other than zero |
| $\theta = \sin\left(\frac{m\lambda}{n_0 l}\right)$: | Diffraction angle of exit light rays |
| or $\mu = \left\{1 - \left(\frac{m\lambda}{n_0 l}\right)^2\right\}^{-\frac{1}{2}}$: | Reciprocal of cos $\theta$. |

In addition, a zero-order diffraction efficiency $\eta_0$ of incident light rays perpendicular to the incident surface 3 of a flat phase grating or a phase grating having a sectional structure in a square waveform and a m-order diffraction efficiency $\eta_m$ are denoted respectively on the basis of an amplitude intensity of a total incident light rays as follows:

$$\eta_0 = 1 - 4a(1-a)\sin^2 \delta \tag{1}$$

$$\eta_m = \frac{4}{(m\pi)^2} \sin^2(m\pi a) \sin^2 \delta \tag{2}$$

Where using refractive indexes $n_a$ and $n_b$, a difference in level d of the grating elements a, b, and $\delta^*$ in place of $\delta$, $$\delta^* = \pi/\lambda \{d_a(n_a - n_b) + d(n_b - \mu n_0)\}.$$

Figure 3:
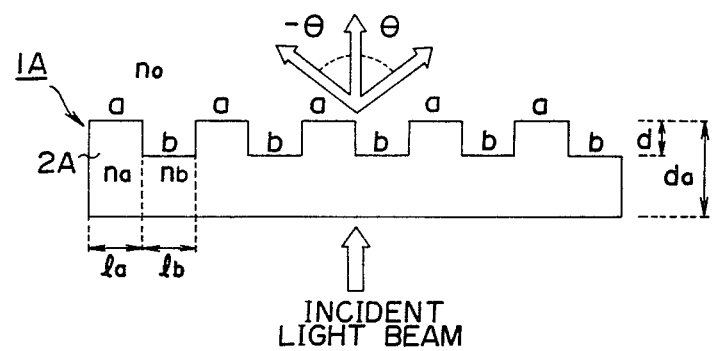
FIG. 3 is an enlarged section view of a phase grating of a convention pattern modification type.

The phase grating 1A shown in FIG. 3 obtains the following value by placing the refractive indexes $n_a = n_b$ and $\delta = \delta^s$ in the above statements of the phase grating 1 shown in FIG. 1.

$$\delta^s = \frac{\pi}{\lambda} d(n_a - \mu n_0).$$

Figure 4:
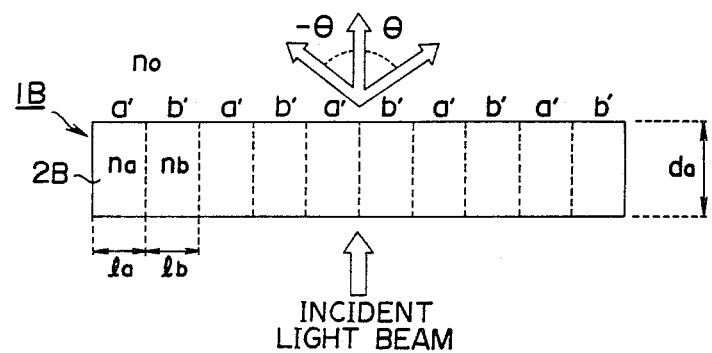
FIG. 4 is an enlarged section view of a phase grating of a conventional refraction modification type.

The phase grating 1B shown in FIG. 4 obtains the following value relation by placing the difference in level d=0 and $\delta = \delta^r$ in the above statements of the phase grating 1 shown in FIG. 1.

$$\delta^r = \frac{\pi}{\lambda} d_a(n_a - n_b)$$

When the following relationships hold for practical conditions $0 < \mu n_0 < n_b < n_a$ and $0 \leq d \leq d_a$, since $\delta^s > 0$, $\delta^r > 0$, $$\delta^* = \frac{\pi}{\lambda} d(n_b - n_0) + \delta^r > 0,$$

$$\delta^* - \delta^s = \frac{\pi}{\lambda}(d_a - d)(n_a - n_b) > 0,$$

$$\delta^* - \delta^r = \frac{\pi}{\lambda} d(n_b - \mu n_0) > 0,$$

then $\delta^r, \delta^s < \delta^*$.

Accordingly, let $\eta_0$ and $\eta_m$ denote a zero-order and a m-order diffraction efficiency of the phase grating 1, respectively, and $\eta^s_0$, $\eta^s_m$ and $\eta^r_0$, $\eta^r_m$ denote a zero-order and a m-order diffraction efficiency of the phase gratings 1A and 1B, respectively.

The the following relationships hold:

$$\eta^*_0 < \eta^s_0, \eta^r_0 \text{ and } \eta^*_m > \eta^s_m, \eta^r_m$$

within the following ranges $$\delta^* \leq \frac{\pi}{2}, \text{ namely, } d \leq \frac{\lambda - 2d_a(n_a - n_b)}{2(n_b - \mu n_0)}$$

This means that when diffraction light rays from phase gratings other than a zero-order diffracted light rays are amplified by suppressing the latter under conditions that corresponding grating constants are the same, the phase grating 1 of the present invention is superior to either of the pattern and refraction modification type phase grating 1A and 1B.

Accordingly, an m-order diffraction efficiency with the phase grating 1A shown in FIG. 3 which has a refractive index $n_a$ and a difference in level d can be obtained with the phase grating 1 of the present invention which has respective refractive indexes $n_a$, $n_b$ ($n_b < n_a$) of its grating elements a, b and its difference in level smaller than d. As a result of this, when a difference in refractive index between the grating elements can be easily given while manufacturing a phase grating whose pitch is particularly small, working conditions for forming the difference in level can be remarkably relieved.

Photosensitive polymers of acrylic acid or methacrylic acid esters having double bonds between carbons as shown in a following formula that advance their reaction with aldehyde or ketone (hereinafter referred to as a compound (B) are used in the present invention. Of the above polymers, a preferred example is a polymer or a copolymer which includes a structural unit of the following general formula (I) (hereinafter referred to as a polymer (A)):

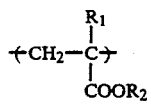

where $R_1$ is a hydrogen atom or an alkyl group of one to four carbons, including at least one non-conjugate double bond, $R_2$ is a substitution group, preferably a chain or cyclic terpene residue.

The structural unit is normally more than two mol %, preferably more than 5 mol %. Mutually non-conjugated double bonds which are bonded to an ester group is within a range of 75 to 85 kcal/mol in its triplet energy and is extremely high in sensitivity to the compound (B) by light excitation. Since the triplet energy of conjugated double bonds is lower than that of the compound (B) (within a range of 64 to 74 kcal/mol), migration of the light excitation energy occurs in preference to light reaction and thus no light reaction is produced.

Examples of substituent $R_2$ including one non-conjugated type double bond are as follows:

Substituents including three carbons such as allyl; substituents including four carbons such as 2-butenyl, 3-butenyl and 2-methyl-2-propenyl; substituents including five carbons, such as 2-heptenyl, 3-heptenyl, 4-heptenyl, 2-methyl-2-butenyl, 3-methyl-2-butenyl, 2-ethyl-2-propenyl, 2-methyl-3-butenyl and 1,2-dimethyl-2-propenyl; substituents including six carbons, such as 2-hexenyl, 3-hexenyl, 4-hexenyl, 5-hexenyl, 1,1-dimethyl-2-butenyl, 1,2-dimethyl-2-butenyl, 1,3-dimethyl-2-butenyl, 2,3-dimethyl-2-butenyl, 3-methyl-2-heptenyl and 2-methyl-2-heptenyl; or cycloalkenyl substituents, such as 2-methyl-2-cyclohexenyl and 3-methyl-2-cyclohexenyl.

Examples of substituents $R_2$ including two non-conjugated double bonds are as follows:

Geranyl, isogeranyl, 1-methylgeranyl, 6-methylgeranyl, 6-ethylgeranyl, neryl and lavandulyl.

Examples of substituents $R_2$ including three or more non-conjugated double bonds are as follows:

Geranylgeranyl, farnesyl and β-cyclogeranyl-geranyl.

As long as the polymer (A) has a structure shown in the general formula (I), its method of manufacturing is of no particular importance. Specifically, it is possible to obtain polymer (A) by using a polymer including acrylic acid or methacrylic acid and by allowing it to react with alcohol including double bonds within its molecules, for example, an alcohol such as 2-butenol (esterification of the carboxyl group in the polymer). Polymers are especially suitable for use are those obtained by polymerization of acrylic acid derivatives corresponding to the formula (I) or copolymerization with other comonomers.

Examples of acrylic acid derivatives including one double bond are as follows:

Acrylic acid derivatives including chain alcohol residues, such as allyl methacrylate, allyl acrylate, 2-(or 3)-butenyl methacrylate, 2 (or 3)-butenyl acrylate, 2-methyl-2-propenyl methacrylate, 2-methyl-2-propenyl acrylate, 2 (or 3 or 4)-heptenyl methacrylate, 2 (or 3 or 4)-acrylate, 2 (or 3)-methyl-2 (or 3)-butenyl methacrylate, 2 (or 3)-methyl-2 (or 3)-butenylacrylate, 2-ethyl-2-propenyl methacrylate, 2-ethyl-2-propenyl acrylate, 1,2-dimethyl-2-propenyl methacrylate, 1,2-dimethyl-2-propenyl acrylate, 2 (or 3 or 4 or 5)-hexenyl methacrylate, 2 (or 3 or 4 or 5)-hexenyl acrylate, 1,1 (or 1,2 or 1,3 or 2,3)-dimethyl-2-butenyl methacrylate, 1,1-(or 1,2 or 1,3 or 2,3)-dimethyl-2-butenyl acrylate, 2 (or 3)-methyl-2-heptenyl methacrylate, and 2 (or 3)-methyl-2-heptenyl acrylate; acrylic acid derivatives including cyclic alcohol residues, such as 2 (or 3)-methyl-2-cyclohexenyl methacrylate and 2 (or 3)-methyl-2-cyclohexenyl acrylate.

Of these, allylmethacrylate, 2-methyl-2-propenyl methacrylate, 2-butenyl methacrylate, 2-hexenyl methacrylate and 3-hexenyl methacrylate are desirable because it is easy to obtain the alcohol residues and to synthesize the ester.

Preferred examples of acrylic acid derivatives including two or more double bonds are as follows:

Esters of chain or cyclic terpene series alcohol including two non-conjugate double bonds with acrylic acid or methacrylic acid, such as geranyl methacrylate, geranyl acrylate, neryl methacrylate, neryl acrylate, isogeranyl methacrylate, isogeranyl acrylate, lavandulyl methacrylate, lavandulyl acrylate, 6-methyl geranyl methacrylate, 1-methyl geranyl methacrylate, 1-methyl geranyl acrylate, 6-ethyl geranyl methacrylate, 6-ethyl geranyl acrylate, perylyl methacrylate and perylyl acrylate; and esters of chain or cyclic terpene series alcohol including three or more non-conjugate double bonds with acrylic acid or methacrylic acid, such as farnesyl methacrylate, farnesyl acrylate, geranylgeranyl methacrylate, geranylgeranyl acrylate, β-cyclogeranylgeranylacrylate.

Comonomers can be copolymerized with the aforementioned acrylic acid ester derivatives. Examples are methacrylic acid; methacrylic acid alkyl ester, such as methyl methacrylate, ethyl methacrylate, propyl methacrylate, butyl methacrylate, amyl methacrylate and cyclohexyl methacrylate; acrylic acid alkyl ester, such as acrylic acid, methyl acrylate, ethyl acrylate, propyl acrylate, butyl acrylate and cyclohexyl acrylate; acid amides, such as methacrylic acid amide, acrylic acid amide; styrene and its derivatives such as α-methyl styrene.

These comonomers may be substituted by fluorine. However, a cyclic compound of the π electron system such as an aromatic group has a large molecular volume and a large number of π electrons, and also has the function of increasing both its volume and refractive index. Consequently, when film thickness and refractive index of an exposed portion is increased by applying a light reaction with aromatic ketone, it is desired that the methacrylic acid ester has no cyclic structure of π electron system.

Synthesis of polymers having double bonds between carbons in the above alcohol residue can be generally achieved by radical polymerization or anion polymerization when two or more alkyl radicals are substituted in cis or trans isomerism in double bonds between carbons of alcohol residue of acrylic acid derivative monomer and can be easily achieved by anion polymerization when the double bond between carbons constitutes a vinyl radical or a vinylidene radical. Upon polymerization, there is possibly the case that the double bond between carbons will take part to some degree by a secondary reaction. In the polymer (A), however, it is better that the double bond does not participate substantially in copolymerization. There is no limitation in the molecular weight of the polymer (A) but it is generally within a range of 1000 to a million in average molecular weight. It is found that the structural unit (I) in the polymer (A) undergoes a remarkable change in nature by reaction on the composition (B) when present at more than 5 mol % in monomer unit.

The compound (B), which has functions of increasing the differences in level of convex-concavo portions and in refracrtive index, is divided broadly into compounds including one carbonyl group and those including two or more carbonyl groups. Examples of the compound (B) are non-substituted or substituted benzaldehyde, benzophenone or their derivatives and they are represented by the following general formula (II) or (III).

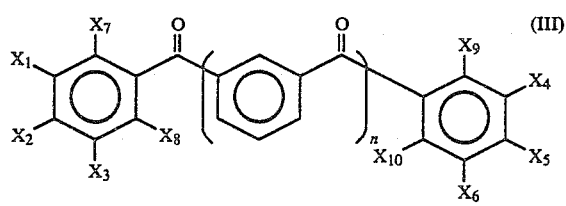

where $X_1$ to $X_6$ represent hydrogen atoms, alkyl group including one to seven carbons, alkoxyl group including one to seven carbons, allyloxy group or halogen atoms, $X_7$ to $X_{10}$ represent hydrogen atoms or halogen atoms, and n is zero or an integer.

Preferred examples of the compound (B) are substitued benzophones, such as benzophenone, 3-(or 4-) methyl benzophenone, 3-(or 4-)methoxybenzophenone, 3,3'-(or 4,4'-)dimethyl benzophenone, 3,3'-(or 4,4'-) dimethoxy benzophenone 2,3-(or 4-)chlorobenzophenone, 3,4,5-trimethyl benzophenone and 3,4,5-trimethoxy benzophenone; substituted 3-benzoyl benzophenones, such as 3-benzoyl benzophenone, 3-(3 or 4-methylbenzoyl)-3' or 4' methyl benzophenone, 3-(3 or 4-methoxybenzoyl)-3' or 4' methyl benzophenone and 3,3'-dibenzoyl benzophenone; and substituted benzaldehydes, such as benzaldehyde, 3-(or 4-)methyl benzaldehyde, 3-(or 4-) methoxybenzaldehyde, 3,4-dimethyl benzaldehyde and 3,4-dimethoxy benzaldehyde.

Since these compounds (B) have no substituents such as methyl, ethyl and isopropyl radicals ortho to a carbonyl group, they are advantageous in that a secondary reaction such as a hydrogen-abstraction reaction within molecules by light irradiation is reduced. It is to be understood that in the present invention benzaldehyde, benzophenone, 3-benzoyl benzophenone and 3,3'-dibenzoyl benzophenone are of particular advantage for the reason of ease in photosensitivity and synthesis and also 3-benzoyl benzophenone and 3,3'-dibenzoyl benzophenone are particularly advantageous compounds (B) for the reason of advantageous properties in photosensitivity, difference in refractive index and formation of a relief structure.

Under the condition that these aromatic ketones coexist with photosensitive copolymers having double bonds between carbons, both of them form an oxetane ring and are bonded in a reaction manner as shown in the following formula (3), for example, when irradiated by ultraviolet rays of wavelength 300 to 400 nm.

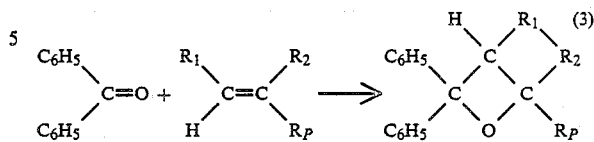

where $R_1$ and $R_2$ are suitable substitutents and $R_P$ is a copolymer.

In order to selectively advance the photoreaction, it is necessary that the triplet energy of the aromatic ketone is lower than that of double bonds between carbons on copolymer. In the case of the reverse, optical excitation energy migrates preferentially from the aromatic ketone to the double bonds between carbons and thus will be wasted. From this viewpoint, the conjugated type double bonds between carbons are unsuitable and aromatic ketones in a range of 65 kcal/mol to 77 kcal/mol in triplet energy are useful. In addition, in order to ease developing conditions with a heating process under a reduced pressure, it is desirable to use easily sublimable aromatic ketone.

The difference in level and refractive index between an exposed portion and an unexposed portion vary depending upon not only the kind and concentration of material to be used but also film thickness before irradiation of ultraviolet rays, output of a light source, irradiation time duration of ultraviolet rays, temperature and the like. With the knowledge of characteristics of factors regarding the differences in level and refractive index, it is possible to easily manufacture combination pattern-refraction modification type phase gratings having desired differences in level and refractive index.

A method for manufacturing diffraction gratings according to the present invention will be now described hereinafter.

The polymer (A) and the compound (B) are dissolved in a solvent which dissolves both of them and used to form a coated film by means of a common method such as a casting, bar-coating or spin coating. The solvent, if required, is removed from the coated film under a reduced pressure or by heating to form a film of composition according to the present invention. The film may be a layer or a thin film formed on a substrate. As for the formation of the film, various methods can be selected depending upon a desired thickness or configuration of the film. In general, a casting process is selected for a thick film and a bar-coating or a spin-coating process is selected for a thin film but other processes may be selected. The ratio of the polymer (A) to the compound (B) is not especially limited but in general it is optionally selected within a range of 10:1 to 1:10 in the weight ratio. The mol ratio of the compound (B) to alcohol residues including non-conjugate double bonds in the polymer (A) is selected optionally within a range of 10:1 to 1:20, preferably within a range of 5:1 to 1:10.

The exposure is effected by irradiation of ultraviolet rays of wavelength 300 to 420 nm on a regularly arranged pattern. For examples, a high pressure mercury-vapor lamp, ultra-high pressure mercury-vapor lamp, $N_2$ gas laser, He-Cd gas laser and the like are employed. For the exposure process, a method using a photomask, two light beam interference exposure method, laser beam directly applying method and the like can be employed.

The manufacturing method according to the present invention can be achieved by eliminating the compound (B) with an optional method after the exposure process of the above film. By way of example, the compound (B) at an unexposed portion and non-reacted compound (B) are eliminated by effecting such treatment at a temperature of 0° C. to 120° C. under a reduced or atmospheric pressure, whereby an optically transparent and clear diffraction grating can be produced which has a relief structure having both of a desired pattern and difference in refractive index. According to the manufacturing method of the present invention, the refractive index of the exposed portion is larger than that of the unexposed portion and the exposed portion has a convex structure whose thickness is larger than that of the unexposed portion. As a result, it is possible to easily obtain combination pattern-refraction modification phase gratings.

Studying the method for controlling the difference in refractive index and a relief structure, it is found that with the composition of the present invention they are optionally controllable by (1) the ratio of the polymer (A) in the composition, the ratio of structural units represented by the general formula (I) in the polymer (A) and the ratio of the compound (B), (2) exposure time duration, or (3) a combination of these.

Generally, when a compound having a large number of phenyl rings is used as the compound (B) in the composition or when a polymer having a large number of non-conjugated double bonds in the polymer (A) is used, the difference in refractive index is increased. In addition, the greater the ratio of the compound (B) to the polymer (A), the deeper is the relief structure. The longer the reaction time duration, the more the reaction, so that both of the difference in refractive index and the depth of the relief structure are increased. It should be understood, however, that these conditions should be properly selected from ratios of the polymer (A and the compound (B) in the composition, the film thickness of the composition and the like.

The phase grating 1 shown in FIG. 1 has a simplest structure in which an exit light pattern of laser beams which are perpendicularly incident upon the incident surface 3 shows a diffracted spot group arranged in a straight line around a spot of the zero-order diffracted light rays on a screen disposed in parallel to the grating surface. The present invention, however, is not limited to such phase grating as constructed above.

Figure 2:
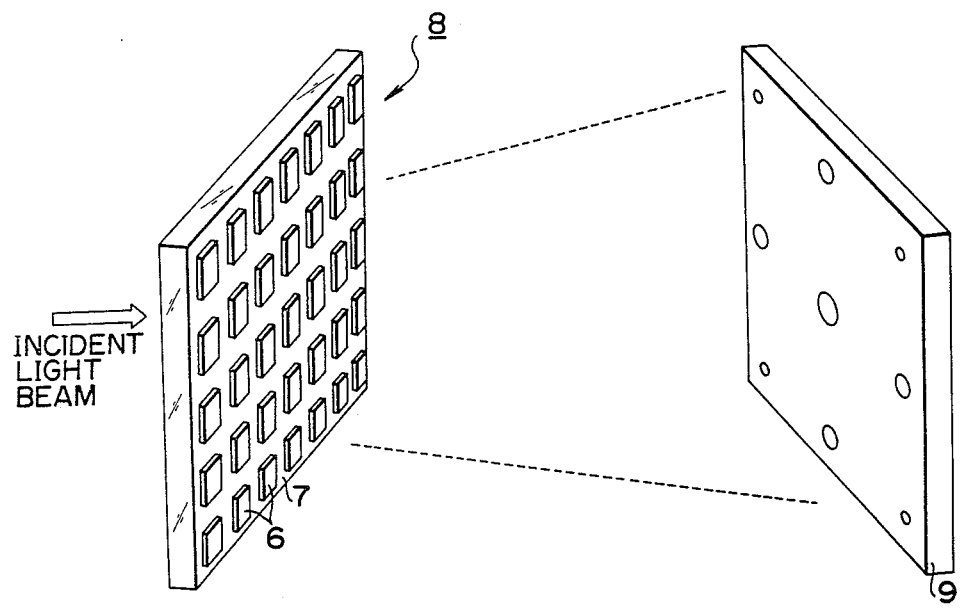
FIG. 2 are an enlarged perspective view of another phase grating of the combination pattern-refraction modification type in a check and a perspective view showing a diffraction pattern.

By way of example, as shown in FIG. 2, with a phase grating 8 of the combination pattern-refraction modification type in which a convex portion 6 having a high refractive index and a concave portion 7 having a low refractive index are arranged checkerwise, when laser beams are perpendicularly incident upon an incident surface of the phase grating 8, a diffracted spot group arranged in two-dimensions around a spot of zero-order diffracted light beams on a screen 9 will be observed. The phase grating 8 is an element for obtained five laser beams equivalent to a zero-order diffracted light beam and four diffracted light beams nearest thereto, for example, from a single laser beam.

In addition to the above structures, it is possible to construct combination pattern-refraction modification type phase gratings for various uses. Consequently, the present invention is broadly useful particularly to distribution and focusing of light beams in accordnace with control of diffraction angle and efficiency as an element of a microoptical system which deals with light beams at a level of light wavelength.

Now, the diffraction efficiency of the present invention will be quantitatively evaluated using the equations (1) and (2). Tables 1 and 2 indicate diffraction efficiencies in the case of $n_a = 1.51$ and $n_b = 1.50$ and the case of $n_a = 1.55$ and $n_b = 1.45$, respectively, on conditions of wavelength $\lambda = 0.780$ μm, $l_z = 10.0$ μm, $l_b = 10.0$ μm, $d_a = 1.00$ μm and $n_0 = 1.00$.

TABLE 1

| | Diffraction efficiencies when $n_a = 1.51$, $n_b = 1.50$ | | | |
|---|---|---|---|---|
| d (μm) | $\eta^*_0$ | $\eta_0^s$ | $\eta^*_{\pm 1}$ | $\eta^s_{\pm 1}$ |
| 0.000 | 0.998 | 1.000 | 0.001 | 0.000 |
| 0.100 | 0.943 | 0.958 | 0.023 | 0.017 |
| 0.200 | 0.816 | 0.840 | 0.074 | 0.064 |
| 0.300 | 0.639 | 0.666 | 0.146 | 0.138 |
| 0.400 | 0.440 | 0.464 | 0.228 | 0.218 |
| 0.500 | 0.250 | 0.268 | 0.305 | 0.297 |

TABLE 2

| | Diffraction efficiencies when $n_a = 1.55$, $n_b = 1.45$ | | | |
|---|---|---|---|---|
| d (μm) | $\eta^*_0$ | $\eta_0^s$ | $\eta^*_{\pm 1}$ | $\eta^s_{\pm 1}$ |
| 0.000 | 0.846 | 1.000 | 0.062 | 0.000 |
| 0.100 | 0.696 | 0.951 | 0.123 | 0.019 |
| 0.200 | 0.520 | 0.816 | 0.194 | 0.074 |
| 0.300 | 0.342 | 0.620 | 0.267 | 0.155 |
| 0.400 | 0.184 | 0.400 | 0.331 | 0.244 |
| 0.500 | 0.066 | 0.200 | 0.378 | 0.325 |

Manufacturing methods and optical characteristics of the combination pattern-refraction modification phase gratings according to the present invention will be described hereinafter with reference to the following embodiments.

EMBODIMENT 1

A copolymer of methylmethacrylate and 2-butenyl methacrylate of a mol ratio 1:1 was synthesized. A 4 weight % benzene solution was prepared by adding benzophenone (1 mol) to 2-butenyl methacrylate component (1 mol) was spin-coated on a poly(methyl methacryalte) substrate to form a transparent thin film. The thin film was irradiated with ultraviolet light beams from an ultra-high pressure mercury-vapor lamp of output 250 W for twenty minutes through a photomask having a striped pattern in which line and spacing of grating elements were both 10 μm, thereby allowing benzophenone to be bonded to 2-butenyl methacrylate component. This sample was heated for one hour under circumstances of 0.2 mmHg and 100° C. to allow non-reacted benzophenone to sublime, thereby the combination pattern-refraction modification phase grating being manufactured. As the results of measurement with a two-beam interference microscope, film thickness at an exposed portion and an unexposed portion were 0.803 μm and 0.711 μm, respectively, and the difference in level was 0.092 μm. As the results of measurement with a prism coupling method using He-Ne laser of wavelength 6328 Å, refractive indexes at the exposed portion and the unexposed portion were 1.522 and 1.510, respectively. As the results of measurement using the laser and a light power meter, an intensity ratio ($\eta^*_1/\eta^*_0$) of 1-order to 0-order diffracted light beams was 0.034, which corresponds to a theoretical value 0.034.

EMBODIMENT 2

As the result of a similar experiment by adding 3-benzoylbenzophenone (0.7 mol) in place of benzophenone in Embodiment 1 to 2-butenyl methacrylate component (1 mol), the film thicknesses at an exposed portion and an unexposed portion were 1.015 μm and 0.761 μm, respectively, the difference in level therebetween was 0.254 μm and refractive indexes at the exposed and unexposed portions were 1.544 and 1.510, respectively. The intensity ratio between 1- and 0-order diffracted light beams was 0.454, which well corresponds to a theoretical value 0.456.

EMBODIMENT 3

A copolymer including methyl methacrylate and geranyl methacrylate of a mol ratio 1:1 was synthesized. As the result of an experiment similar to that of Embodiment 1 by adding benzophenone (1.4 mol) to geranyl methacrylate component (1 mol), film thicknesses at an exposed and an unexposed portions were 0.798 μm and 0.670 μm, respectively, the difference in level therebetween was 0.128 μm and refractive indexes at the exposed and unexposed portions were 1.530 and 1.513, respectively. The intensity ratio between the exposed and unexposed portions was 1.588, which well corresponds to a theoretical value 1.593.

EMBODIMENT 4

As the result of a similar experiment by adding 3-benzoylbenzophenone (0.9 mol) in place of benzophenone in Embodiment 3, to geranyl methacrylate component (1 mol), film thicknesses at an exposed and an unexposed portions were 0.997 μm and 0.648 μm, respectively, the difference in level therebetween was 0.349 μm and refractive indexes at the exposed and unexposed portions were 1.557 and 1.514, respectively. The intensity ratio between 1- and 0-order diffracted light beams was 1.588, which well corresponds to a theoretical value 1.593.

What is claimed is:

1. A process for manufacturing a phase grating having combined pattern modification and refraction modification, comprising the steps of:
   (1) forming a thin film of composition which includes:
   (A) a polymer having double bonds between two carbons containing the moiety

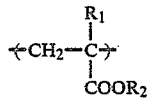

where
   $R_1$ represents a hydrogen atom or an alkyl substituent of one to four carbons, and
   $R_2$ represents a substituent including at least one non-conjugated carbon-carbon double bond, and
   (B) at least one aromatic aldehyde or aromatic ketone which absorbs ultraviolet rays of 300 to 400 nm wavelength;
   (2) irradiating the thin film in a regularly arranged pattern of ultraviolet rays, whereby compound (B) reacts with polymer (A) in the areas of irradiation; and
   (3) removing non-reacted compound (B), whereby a regularly pattern of irradiated areas of reaction product having a greater thickness and a greater refractive index than areas not irradiated of polymer (A) without compound (B) is realized.

2. A process according to claim 1, in which the aromatic aldehyde and the aromatic ketone comprise at least one carbonyl group and have the following general formula (II) or (III):

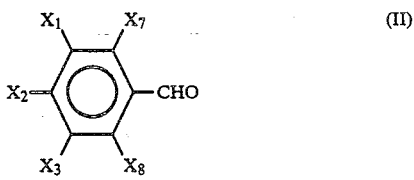

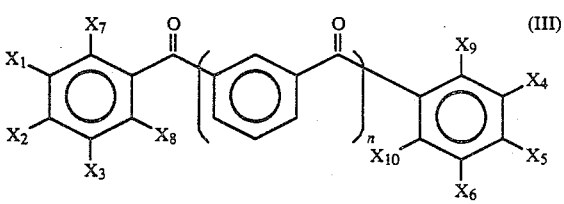

where
$X_1$ to $X_6$ represent hydrogen, alkyl group of one to seven carbons, alkoxy group or allyloxy group of one to seven carbons, or halogen and
$X_7$ to $X_{10}$ represent hydrogen or halogen, and
n represents zero or an integer.

3. A method according to claim 2, in which the aromatic ketone has a triplet energy within a range from 65 kcal/mol to 77 kcal/mol.

4. A process according to claim 1 in which the mol ratio of said compound (B) to substituent $R_2$ in polymer (A) is in the range of 10:1 to 1:20.

5. A method according to claim 4 wherein the mol ratio is in the range of 5:1 to 1:10.

6. A method according to claim 4 in which the polymer is an acrylic acid or methacrylic acid ester polymer.

7. A process for manufacturing a phase grating having combined pattern modification and refraction modification, comprising the steps of:
   (1) forming a thin film of composition which includes:
   (A) a polymer having double bonds between two carbons containing the moiety

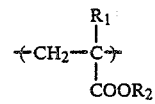

where
   $R_1$ represents a hydrogen atom or an alkyl substituent of one to four carbons, and
   $R_2$ represents a substituent including at least one non-conjugated carbon-carbon double bond, and
   (B) at least one aromatic aldehyde or aromatic ketone which absorbs ultraviolet rays of 300 to 400 nm wavelength;
   (2) irradiating the thin film in a regularly arranged pattern of ultraviolet rays, whereby compound (B) reacts with polymer (A) in the areas of irradiation; and
   (3) removing non-reacted compound (B) by heating under a reduced pressure, whereby a regularly pattern of irradiated areas having a greater thickness and a greater refractive index than areas not irradiated is realized.

8. A process for manufacturing a phase grating having combined pattern modification and refraction modification, comprising the steps of:

(1) forming a thin film of composition which includes:
(A) a polymer having double bonds between two carbons containing the moiety

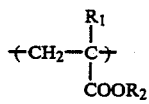

where
$R_1$ represents a hydrogen atom or an alkyl substituent of one to four carbons, and
$R_2$ represents a substituent including at least one non-conjugated carbon-carbon double bond, and is the residue obtained upon removal of hydroxyl from a terpene
(B) at least one aromatic aldehyde or aromatic ketone which absorbs ultraviolet rays of 300 to 400 μm wavelength;

(2) irradiating the thin film in a regularly arranged pattern of ultraviolet rays, whereby compound (B) reacts with polymer (A) in the areas of irradiation; and (3) removing non-reacted compound (B), whereby a regularly pattern of irradiated areas having a greater thickness and a greater refractive index than areas not irradiated is realized.

9. A process for manufacturing a phase grating having combined pattern modification and refraction modification, comprising the steps of:

(1) forming a thin film of composition which includes:
(A) a polymer having double bonds between two carbons which is a copolymer of methyl methacrylate and 2-butenyl methacrylate, and
(B) at least one aromatic aldehyde or aromatic ketone which absorbs ultraviolet rays of 300 to 400 nm wavelength and is benzophenone or 3-benzoyl-benzophenone;

(2) irradiating the thin film in a regularly arranged pattern of ultraviolet rays, whereby compound (B) reacts with polymer (A) in the areas of irradiation; and (3) removing non-reacted compound (B), whereby a regularly pattern of irradiated areas having a greater thickness and a greater refractive index than areas not irradiated is realized.

10. A process for manufacturing a phase grating having combined pattern modification and refraction modification, comprising the steps of:

(1) forming a thin film of composition which includes:
(A) a polymer having double bonds between two carbons which is a copolymer of methyl methacrylate and geranyl methacrylate, and
(B) at least one aromatic aldehyde or aromatic ketone which absorbs ultraviolet rays of 300 to 400 nm wavelength;

(2) irradiating the thin film in a regularly arranged pattern of ultraviolet rays, whereby compound (B) reacts with polymer (A) in the areas of irradiation; and (3) removing non-reacted compound (B), whereby a regularly pattern of irradiated areas having a greater thickness and a greater refractive index than areas not irradiated is realized.

* * * * *